United States Patent Office 3,178,283

Patented Apr. 13, 1965

3,178,283

PRODUCTION OF PHOTOGRAPHIC POLYMERIC IMAGES BY HEAT DEVELOPMENT

Frederick W. Millard and Richard F. Laman, Binghamton, N.Y., assignors to General Aniline & Film Corporation, New York, N.Y., a corporation of Delaware No Drawing. Filed May 4, 1961, Ser. No. 107,669
25 Claims. (Cl. 96—49)

This invention relates to a recording system based on the production of polymeric images. This invention is particularly concerned with the utilization of the photodecomposition products of an aromatic light sensitive diazo compound to control or modulate polymerization induced by thermal initiators. The invention also pertains to polymeric images formed in this manner and to photosensitive compositions for producing such images.

It is well known that certain unsaturated organic compounds undergo polymerization when subjected to the action of radiation, and this phenomenon has engaged the attention of many scientific investigators. It was realized, even many years ago, that the application of radiant energy to effect polymerization was especially intriguing in the field of imagewise polymerization, since this system offered a means of obtaining polymeric relief images useful in the photomechanical and related arts. The need of a substitute for the old bichromate gelatin method of forming resists prompted much of the research into the production of photopolymer images.

The general procedure of forming photopolymer images involves the coating of a suitable support or base with a monomer or mixture of monomers followed by exposure to a high intensity light source or pattern. In the exposed areas, the monomer is polymerized to a more or less hard insoluble mass, whereas the unexposed areas contain uneffected monomer which can then be removed, leaving a relief image consisting of a plasticized or polymerized film. These early photopolymer systems were generally unsatisfactory in practice and required inordinately long exposure periods to sufficiently toughen or polymerize the monomer to a film which would not be washed away with the monomer in the unexposed areas. Furthermore, the low speed of the sensitized elements necessitated the use of extremely high intensity radiation sources, preferably carbon arcs or bright sunlight.

With a view to uncovering photopolymer systems of higher sensitivity, a wide variety of polymerizable compounds have been investigated. Thus, Minsk et al. in U.S.P. 2,610,120, describes the use of light sensitive polymeric cinnamic acid esters such as polyvinyl cinnamate sensitized with various nitro compounds. According to the one example of this patent, a coating embodying such light sensitive polyvinyl cinnamates required an exposure under a line or halftone image of one minute placed at a distance of 4 feet from a 35 amp white flame carbon arc. Manifestly, these photopolymer compositions possessed extremely low response to radiation. Gerhardt, in U.S.P. 2,673,151, discloses a light sensitive copolymerizable mixture of (1) polyesters of $\alpha,\beta$-ethylenic, $\alpha,\beta$-dicarboxylic acids, and (2) ethylenically unsaturated compounds copolymerized therewith, such a composition being sensitized by the addition of sulfur compounds. In this patent, it is suggested that such a composition be exposed by contact or by projection to the desired image until a gel stage is reached. The radiation used in this instance was of the high intensity type such as sunlight or light from a carbon arc, i.e., a source rich in ultraviolet radiation. In a more recent patent, U.S.P. 2,831,768, are described light sensitive polyvinyl arylphenones having increased photographic speed. According to Example 1 of the patent, which is the only example therein containing photographic data, a coating using a light sensitive arylphenone required an exposure of 2 minutes at a distance of 10 inches from a sunlamp in order to effect imagewise polymerization.

It should also be noted that the high intensity radiant energy sources employed in the photopolymerization systems described above also produce a large quantity of infrared and heat rays. As a consequence, a certain portion of the monomer or monomers may be polymerized by the action of heat, and this may interfere with the formation of a clean and sharp relief image. Thus, if a black and white silver negative pattern is used, there should normally be no polymerized areas under the dark portions of the pattern. However, such dark portions may possibly absorb some radiant heat with sufficient local rise in temperature to effect heat polymerization of the monomer in the light unexposed areas. As a consequence, in those systems where a light source which also has appreciable radiant heat output is used to initiate polymerization of the light sensitive layer under a black and white pattern, clean-cut modulation of the polymerization would not be effected.

It is thus believed to be manifest that a need exists in the photographic and kindred arts for a system of producing polymeric images having increased speed of response to the exposing radiation.

It is accordingly the primary aim and purpose of this invention to provide superior light sensitive materials for use in forming polymeric photographic images. It is also an important object of this invention to provide a method of producing these light sensitive materials. Another object is to describe the preferred applications for the sensitized materials. Other objects will become apparent as the description proceeds.

We have discovered that the above enumerated objects can be realized by utilizing the photodecomposition products of an aromatic light sensitive diazo compound to control or modulate polymerization of ethylenically unsaturated monomeric compounds wherein a thermal initiator is employed for the purpose of triggering such polymerization.

It is to be especially noted that the method as herein described for the production of polymeric images is not based on photopolymerization since the exposing radiation does not trigger or cause the polymerization, but serves the function of providing varying quantities of photopolymerization inhibitors in the form of decomposition products of light sensitive aromatic diazo compounds. Our system of forming polymeric images thus represents a departure from the prior art systems which operate by the direct action of radiation on polymeric materials with or without the catalytic assistance of photoinitiators. By the use of our technique, it becomes possible to harness the relatively high actinic sensitivity of aromatic diazo compounds for yielding high speed polymeric images. In other words, we utilize a thermal polymerization reaction for efficient polymerization coupled with the relatively high sensitivity of a radiation sensitive diazo compound for modulating the vigorous thermal-induced polymerization. The concept of utilizing an intermediate image composed of the photodecomposition products of an aromatic diazo compound enables us to obtain polymeric images by relatively feeble exposure to light or other actinic radiation and, therefore, achieve a substantial increase in speed over the hitherto known photopolymerizable compositions.

As previously pointed out, our invention is predicated on the discovery that the photodecomposition products of aromatic diazo compounds can be used to moderate or otherwise control polymerization of the type initiated by thermal initiators. The latter substances, when subjected to heat or thermal homolysis, as is sometimes known, initiate vinyl polymerization. This technique is well known and widely employed in industrial polymerizations. Presumably, thermal initiators operate via free radicals, which are produced on thermal homolysis. Organic peroxides and hydroperoxides, azo compounds, and inorganic peroxides such as persulfates and borates are typical thermal initiators. Specific examples of these include benzoyl peroxide, acetyl peroxide, α,α'-azodiisobutyronitrile, t-butylhydroperoxide, cumene hydroperoxide, di-t-butyl peroxide, azodicyclohexylcarbonitrile, dimethyl-α,α-azodiisobutyrate, succinyl peroxide, dicumyl peroxide and dichlorobenzoyl peroxide.

Any normally liquid to solid polymerizable unsaturated organic compound is applicable in the practice of my invention. Preferably, such compounds should be ethylenically unsaturated, i.e., contain at least one nonaromatic double bond between adjacent carbon atoms. Compounds particularly advantageous are the vinyl or vinylidene compounds containing a $CH_2=C<$ group activated by direct attachment to a negative group such as halogen, $>C=O$, $-C\equiv N$, $-C\equiv C$, $-O-$, or aryl. Examples of such polymerizable unsaturated organic compounds include acrylamide, acrylonitrile, N-ethanolacrylamide, methacrylic acid, acrylic acid, calcium acrylate, methacrylamide, vinyl acetate, methylmethacrylate, methylacrylate, ethylacrylate, vinyl benzoate, vinyl pyrrolidone, vinylmethyl ether, vinylbutyl ether, vinylisopropyl ether, vinylisobutyl ether, vinyl butyrate, or mixtures of ethyl acrylate with vinyl acetate and the like.

The above ethylenically unsaturated organic compounds, or monomers as they are sometimes called, may be used either alone or in admixture in order to vary the physical properties such as molecular weight, hardness, etc. of the final polymer. Thus, it is a recognized practice, in order to produce a vinyl polymer of the desired physical properties, to polymerize in the presence of a small amount of an unsaturated compound containing at least two terminal vinyl groups each linked to a carbon atom in a straight chain or in a ring. The function of such compounds is to cross-link the polyvinyl chains. This technique, as used in polymerization, is further described by Kropa and Bradley in vol. 31, No. 12, of "Industrial and Engineering Chemistry," 1939. Among such cross-linking agents for the purpose described herein may be mentioned N,N'-methylenebisacrylamide, triallyl cyanurate, divinyl benzene, divinyl ketones and diglycol diacrylate. Generally speaking, increasing the quantity of cross-linking agents increases the hardness of the polymer obtained in the range wherein the ratio of monomer to cross-linking agent varies from 10:1 to 50:1.

Diazo compounds which are illustrative of the type suitable for practicing the invention are derived from 1,2- and 2,1-amino naphthols, 1,4-amino naphthols and aromatic p-diamines of the benzene series, particularly p-phenylenediamines which are mono or disubstituted at one of the two amino groups. These light sensitive diazo compounds are commonly used in the production of diazotype images and are the diazo derivatives of the following amines:

4-amino-N-methylaniline
4-amino-N-ethylaniline
4-aminodiphenylamine
4-amino-N-(β-hydroxyethyl)aniline
4-amino-N-(2',6'-dibromobenzyl)aniline
4-amino-N,N-dimethylaniline
4-amino-N,N-diethylaniline
4-amino-N,N-dipropylaniline
4-amino-N-methyl-N-(β-hydroxyethyl)aniline
4-amino-N-(β-hydroxyethyl)aniline
4-amino-N-butyl-N-(β-hydroxyethyl)aniline
4-amino-N,N-di(β-hydroxyethyl)aniline
4-amino-N-benzyl-N-ethylaniline
4-amino-N-ethyl-3-methylaniline
4-amino-N,N-dimethyl-3-methylaniline
4-amino-N,N-dimethyl-2-methylaniline
4-amino-N,N-diethyl-3-methylaniline
4-amino-N-ethyl-N-(β-hydroxyethyl)3-methylaniline
4-amino-N-cyclohexyl-2-methoxyaniline
4-amino-N,N-di(β-hydroxyethyl)3-methoxyaniline
4-amino-N,N-diethylamino-3-ethoxyaniline
4-amino-N-benzyl-2,5-diethoxyaniline
4-amino-3-chloro-N,N-di(β-hydroxyethyl)aniline
4-amino-3-carboxy-N,N-diethylaniline
1-amino-2-hydroxynaphthalene-4-sulfonic acid
2-amino-1-hydroxynaphthalene-5-sulfonic acid
2-amino-1-hydroxynaphthalene-3,6-disulfonic acid
3-aminocarbazol, and the like These diazo compounds are employed in the form of their stabilized salts, as exemplified by p-diphenylamine diazonium sulfate or in the form of their zinc chloride or boron trifluoride double salts. As examples of such stabilized double salts, there may be mentioned the zinc chloride or boron trifluoride double salts of:

p-Diethylaminobenzenediazonium chloride
p-Di(β-hydroxyethyl)amino-2-methylbenzenediazonium chloride
p-Ethyl-(β-hydroxyethyl)aminobenzenediazonium chloride
p-Diethylamino-3-ethoxybenzenediazonium chloride and the like In carrying out the invention, we have found that generally excellent results ensue by coating a mixture of a photographic colloid carrier, monomer and light sensitive aromatic diazo salt on a suitable substrate such as a paper base previously coated with the thermal initiator in a solution of a suitable binder or carrier. The resulting photographic element is then exposed through a photographic pattern such as a positive transparency after which development is effected by heating the exposed elements, whereby polymerization rapidly occurs in the non-exposed areas of the light sensitive coating. Final processing includes removal of the unpolymerized monomer and related coating adjuncts by washing the exposed and developed coating with water. There is thus obtained a positive photographic polyemric image firmly bonded to the support.

Since our process advantageously yields a positive image, it is unnecessary to produce an intermediate negative before arriving at a positive reproduction of the original subject matter.

The polymerizable compositions as contemplated by the instant invention can be utilized in a variety of photographic applications. For instance, it is possible to dye the polymer images for obtaining colored reproductions. If desired, the colored aspects of the subject can be photographed through primary filters and the subject rendered in its three subtractively colored primary colors. When images are formed of a subject in this manner, they can be superimposed or placed in registration and, when viewed through white light, result in a colored rendition of the original color aspects of the subject. A black dye or other substance of high optical opacity can be incorporated in the polymer compositions or coatings made thereof, which, when exposed to line copy of similar source material, yield excellent reproduction having the high contrast necessary for graphic applications.

The invention is also useful in the production of relief printing plates for use in the photolithographic arts. Such plates can be fabricated by coating a mixture of monomer or monomers in a suitable solvent plus a small quantity of light sensitive diazonium compound as a photoinitiator. The resulting layer is then exposed to an optical image whereby the non-light struck areas of the coating undergo polymerization. After removal of the unpolymerized monomer in the exposed areas, a polymeric relief image remains firmly bonded to the base material. The resist thus formed can be used as a positive working relief plate. By employing a hydrophilic surface as the support for the light sensitive coating, such as, for instance, a partially saponified cellulose acetate, a plate is produced having greasy ink-receptive and water-receptive areas. In this particular instance, it would be necessary to employ a hydrophobic monomer or a monomer that would give rise to a hydrophobic polymer. Such a plate is commonly used as a negative working offset plate for the manufacture of printed copies.

It has been mentioned that it is preferable to employ a photographic colloid as the carrier for the thermal initiator and light sensitive aromatic diazo compound and in this connection mention is made of the common types of photographic carriers such as polyvinyl alcohol, gelatin, casein, glue, saponified cellulose acetate, carboxymethyl cellulose, starch and the like.

Various materials suitable as supports or bases for the radiation sensitive plates prepared in accordance with the process described herein are exemplified by metal such as aluminum, zinc, brass, copper, stainless steel, terephthalic ester polymers, paper, glass, cellulose triacetate, film, baryta paper and the like.

It has already been noted that it is a distinct advantage that the light sensitive compositions of this invention on exposure and heat development produce polymeric images with relatively low intensity radiation such as, for instance emanates from an ordinary household incandescent lamp or simple UV lamp. Since it is the sensitivity of the diazo compound that governs the sensitivity of the photopolymer compositions, then, manifestly, such compositions have a sensitivity which is essentially equal to that of the diazo light sensitive compound. As is well known in the art, such light sensitive diazo compounds may possess rather high sensitivity and require only a few seconds' exposure to bring about photodecomposition.

In general, light sensitive diazo compounds are photodecomposed most efficiently by radiation rich in UV light, and it is this particular frequency which we have found most effective in practicing the invention. However, it is also possible to use other radiation such as gamma rays, X-rays and the like if a fluorescent material is employed which, on excitation by the shorter wave length, undergoes fluorescence with concomitant emission of UV radiation of a wave length suitable for triggering the photodecomposition of the light sensitive aromatic diazo compounds. Such techniques are known in the art and many silver halide photographic X-ray films make use of an intermediate fluorescent screen for increasing the sensitivity of the emulsion ot X-rays. Manifestly, this technique is applicable to our photosensitive compositions.

The following examples illustrate the invention in greater detail although they are presented by way of illustration only and are not to be construed as limiting the invention except as necessitated by the appended claims.

*Example 1*

A baryta paper base was coated with the following composition:

| | | |
|---|---|---|
| Polyvinyl pyrrolidone K–15 | g | 10 |
| 95% ethanol | ml | 50 |
| α,α'-Azobisisobutyrylnitrile | g | 1 |

The resulting coating was then overlayed with the following composition:

| | | |
|---|---|---|
| Gelatin | g | 5 |
| Water | ml | 50 |
| 2-diazo-1-naphthol-5-sulfonic acid sodium salt | g | 1 |

and 5 ml. of the following monomer solution:

| | Parts |
|---|---|
| Acrylamide | 180 |
| N,N'-methylenebisacrylamide | 7 |
| Water | 120 |

The resulting coating was allowed to dry after which it was exposed through a photographic positive transparency for 2 minutes wherein the light source was a 275 watt photoflood lamp placed at a distance of 15 inches from the sensitive coating. Development was effected by heating the exposed element for 2 minutes in air at 140° C., after which the unpolymerized material was removed by washing under a stream of warm (40–60° C.) water. There was obtained a high definition positive photographic polymeric image firmly bonded to the baryta paper base.

Polyvinylpyrrolidone is a product manufactured by the General Aniline & Film Corporation and is sold under the name of PVA, type NP (non-pharmaceutical) as available in viscosities of K15, K20, K30 and K40. The letter K represents a function of the mean molecular weight of the compound and is derived from the Fikentscher formula $$\frac{\log \eta \text{ rel.}}{c} = \frac{75K_0 2}{1+1.5_0 c} + K_0$$

wherein $c$ is the concentration in g./100 ml. of solution, $\eta$ rel. is the viscosity of the solution compared to the solvent and $K=1000K_0$.

*Example 2*

Onto a baryta paper base was applied a coating having the following composition:

| | | |
|---|---|---|
| Gelatin | g | 2 |
| Water | ml | 50 |
| 4-diazo-N-ethyl-N-(β-hydroxyethyl)-aniline.$ZnCl_2$ | g | 1 |
| Citric acid | g | 1 |

After drying the coating was then overlayed with a second coating having the following composition:

| | | |
|---|---|---|
| Monomer composition of Example 1 | ml | 5 |
| Gelatin | g | 2 |
| Water | ml | 50 |
| Sodium perborate | g | 1 |

After thoroughly drying, the coated baryta paper base was exposed through a positive for 3 minutes. In this case, the light source was also a 275 watt photoflood lamp located at a distance of approximately 15 inches from the sensitized layer. Development was effected by heating the exposed element for 10 seconds in the air at a temperature of 125° C. The final processing included washing the element with warm water whereby the monomer in the exposed areas was removed, leaving a sharp and clear positive photographic polymeric image corresponding to the areas of low exposure.

*Example 3*

Onto a cellulose triacetate clear base previously subbed with a hardened gelatin was coated the following composition:

| | | |
|---|---|---|
| Gelatin | g | 2 |
| Water | ml | 50 |
| 4-diazo-N-ethyl-N-(β-hydroxyethyl)-aniline.$ZnCl_2$ | g | 1 |
| Citric acid | g | 1 |

Onto the coated base was applied a top layer formed from the following ingredients:

| | | |
|---|---|---|
| Monomer composition of Example 1 | ml | 5 |
| Gelatin | g | 2 |
| Water | ml | 50 |
| Wetsit (10%) | ml | 1 |
| Sodium perborate | g | 1 |

To this was added 5 ml. of a mixture comprising 1 g. of dissolved Sudan Red, 50 parts of beta-phenethyl alcohol, 40 parts of tricresyl phosphate and 10 parts of dibutyl phthalate. The mixture was combined in a Waring Blendor and thoroughly agitated in order to form an even dispersion. Afterwards the mixture was coated on the bottom layer containing the light sensitive diazo compound.

After the coating was thoroughly dried, it was exposed through a positive for 5 minutes, the light source being a 275 watt photoflood lamp, situated a distance of 15 inches from the sensitized element. Development was effected by heating for 30 seconds at 135° C. in the open air, after which the unpolymerized monomer and various other coating adjuncts were removed by washing with warm water. There was obtained a brilliant clear sharp positive resist in a brilliant red.

Wetsit is a concentrated liquid wetting and penetrating agent of the alkyl aryl type containing aromatic solvents.

*Example 4*

The procedure of Example 2 was again carried out, but in this instance, the sodium perborate was replaced by potassium persulfate.

We claim:

1. A photographic element for producing direct positive polymeric images by exposure to actinic radiation and heat development, carrying on a suitable support in the following order a first layer comprising a colloidal carrier and in contiguous contact with said first layer a surface layer comprising a photographic colloid carrier material, a normally liquid to solid ethylenically unsaturated monomer containing the group $CH_2{=}C{=}$ which is directly attached to an electronegative group, one of said layers only containing a thermal polymerization initiator selected from the group consisting of organic peroxides, alkali metal persulfates, alkali metal perborates, $\alpha,\alpha'$-azodiisobutyronitrile, azodicyclohexylcarbonitrile and $\alpha,\alpha'$-azodiisobutyrate, capable of initiating and effecting the polymerization of an ethylenically unsaturated monomer upon heating, and the other layer containing a light-sensitive aromatic diazonium compound, the photodecomposition products of which prevent polymerization of the monomer when subjected to heat in the presence of the thermal initiator.

2. A photographic element suitable for producing direct positive polymeric images by exposure, subsequent heat development and washing, said element carrying on a suitable support in the following order a first layer consisting essentially of a colloidal carrier material and as the sole thermal polymerization initiator in said element a thermal polymerization initiator selected from the group consisting of organic peroxides, alkali metal persulfates, alkali metal perborates, $\alpha,\alpha'$-azodiisobutyronitrile, azodicyclohexylcarbonitrile and $\alpha,\alpha'$-azodiisobutyrate, capable of initiating and effecting the polymerization of an ethylenically unsaturated monomer upon heating, and in contiguous contact with said first layer a surface layer comprising a colloidal carrier material, a normally liquid to solid ethylenically unsaturated monomer containing the group $CH_2{=}C{=}$ which is directly attached to an electronegative group, and a light-sensitive aromatic diazonium compond, the photodecomposition products of which are capable of preventing the polymerization of the monomer when the latter is subjected to heat in the presence of the thermal polymerization initiator.

3. The product according to claim 2 wherein the photographic colloid carrier is gelatin.

4. The product according to claim 2 wherein is added to the ethylenically unsaturated monomer a cross-linking agent having at least two $CH_2{=}C{=}$ groups.

5. The product according to claim 4 wherein the cross-linking agent is selected from the class consisting of N,N-methylenebisacrylamide, triallylcyanurate, divinylbenzene, divinylketones and diglycol diacrylate.

6. The product according to claim 2 wherein the thermal polymerization initiator is $\alpha,\alpha'$-azobisisobutyronitrile.

7. The product according to claim 2 wherein the thermal polymerization initiator is sodium perborate.

8. The composition according to claim 2 wherein the light sensitive diazonium compound is a 2-diazo-1-naphthol.

9. A photographic element suitable for producing direct positive polymeric images by exposure, subsequent heat development and washing, said element carrying on a suitable support in the following order a first layer consisting essentially of a colloidal carrier material and a light-sensitive aromatic diazonium compound, and in contiguous contact with said first layer a surface layer comprising a colloidal carrier material, a normally liquid to solid ethylenically unsaturated monomer containing the group $CH_2{=}C{=}$ which is directly attached to an electronegative group and as the sole polymerization initiator in said element a thermal polymerization initiator selected from the group consisting of organic peroxides, alkali metal persulfates, alkali metal perborates, $\alpha,\alpha'$ - azodiisobutyronitrile, azodicyclohexylcarbonitrile and $\alpha,\alpha'$-azodiisobutyrate, capable of initiating and effecting the polymerization of an ethylenically unsaturated monomer upon heating; the photodecomposition products of said light-sensitive aromatic diazonium compound being capable of preventing the polymerization of the monomer when the latter is subjected to heat in the presence of the thermal polymerization initiator.

10. A process for producing a direct positive photographic polymeric image which comprises exposing imagewise to actinic radiation in the region of ultraviolet to visible light a photographic element carrying on a suitable support a first layer consisting essentially of a colloidal carrier material and a light-sensitive aromatic diazonium compound, and in contiguous contact with said first layer a surface layer comprising a colloidal carrier material, a normally liquid to solid ethylenically unsaturated monomer containing the group $CH_2{=}C{=}$ which is directly attached to an electronegative group and as the sole polymerization initiator in said element a thermal polymerization initiator selected from the class consisting of organic peroxides, alkali metal persulfates, alkali metal perborates, $\alpha,\alpha'$-azodiisobutyronitrile, azodicyclohexylcarbonitrile and $\alpha,\alpha'$-azodiisobutyrate, capable of effecting the heat polymerization of said ethylenically unsaturated monomer, the photodecomposition products of said light-sensitive aromatic diazonium compound being capable of preventing the polymerization of the monomer when it is subjected to heat in the presence of said thermal polymerization initiator; developing the exposed layer by subjecting it to an elevated temperature ranging from 125 to 140° C. so as to effect polymerization in the unexposed areas only, the polymerization of the exposed areas being inhibited by said decomposition products of the aromatic diazonium compound, thereby producing a photographic polymeric image in the unexposed areas, and removing by washing the unpolymerized portions in the exposed areas to leave the positive polymeric image firmly bonded on the support.

11. The process according to claim 10 wherein the thermal initiator is sodium perborate.

12. The process according to claim 10 wherein the light-sensitive aromatic diazonium compound is 4-diazo-N-($\beta$-hydroxyethyl)aniline zinc chloride.

13. A process for producing a direct positive photographic polymeric image which comprises imagewise exposing to actinic radiation in the spectral region of ultraviolet to visible light a photographic element comprising a support carrying in the following order a first layer comprising a colloidal carrier material and in contiguous contact with said first layer a surface layer comprising a photographic colloid carrier material, a normally liquid to solid ethylenically unsaturated monomer containing the group $CH_2{=}C{=}$ which is directly attached to an electronegative group, one of said layers only containing a thermal polymerization initiator selected from the group consisting of organic peroxides, alkali metal persulfates, alkali metal perborates, $\alpha,\alpha'$-azodiisobutyronitrile, azodicyclohexylcarbonitrile and $\alpha,\alpha'$-azodiisobutyrate which on subjection to heat effects polymerization of the ethylenically unsaturated monomer; the other of said layers containing a light-sensitive aromatic diazonium compound, the photodecomposition products of which prevent polymerization of the monomer when it is subjected to heat in the presence of said thermal polymerization initiator; developing the exposed layer by subjecting it to elevated temperature so as to effect polymerization in the unexposed areas only, the polymerization of the exposed areas being inhibited by said decomposition products of the aromatic diazonium compound, thereby producing a direct positive photographic polymeric image, and removing by washing the unpolymerized portion in the exposed areas to leave the positive polymeric image firmly bonded to the support.

14. A process according to claim 13 wherein said heating is carried out at a temperature ranging from 125° C. to 140° C.

15. A process for producing a direct positive photographic polymeric image which comprises exposing imagewise to actinic radiation in the region of ultra-violet to visible light a photographic element carrying on a suitable support a first layer consisting essentially of a colloidal carrier material and as the sole thermal polymerization initiator in said element a thermal polymerization initiator selected from the class consisting of organic peroxides, alkali metal persulfates, alkali metal perborates, α,α'-azodiisobutyronitrile, azodicyclohexylcarbonitrile and α,α'-azodiisobutyrate, capable of effecting the heat polymerization of an ethylenically unsaturated monomer, and in contiguous contact with said first layer a surface layer comprising a colloidal carrier material, a normally liquid to solid monomer containing the group $CH_2=C=$ which is directly attached to an electronegative group, and a light-sensitive aromatic diazonium compound, the photodecomposition products of which prevent polymerization of the monomer when it is subjected to heat in the presence of said thermal polymerization initiator; developing the exposed layer by subjecting it to an elevated temperature so as to effect polymerization in the unexposed areas only, the polymerization of the exposed areas being inhibited by said decomposition products of the aromatic diazonium compound, thereby producing a photographic polymeric image in the unexposed areas and removing by washing the unpolymerized portions in the exposed areas to leave the positive polymeric image firmly bonded on the support.

16. A process according to claim 15 wherein said elevated temperature ranges from 125° C. to 140° C.

17. The process according to claim 15 wherein the thermal polymerization initiator is α,α'-azobisisobutyronitrile.

18. The process according to claim 15 wherein the thermal polymerization initiator is sodium perborate.

19. The process according to claim 15 wherein the light-sensitive aromatic diazo compound is a 2-diazo-1-naphthol.

20. A process according to claim 15 wherein the photographic colloid carrier is gelatin.

21. A process according to claim 15 wherein the light sensitive aromatic diazo compound is a p-diazo N,N-dialkylsubstituted aniline.

22. The process according to claim 15 wherein is added to the ethylenically unsaturated monomer a cross-linking agent having at least two $CH_2=C=$ groups.

23. The process according to claim 22 wherein the cross-linking agent is selected from the class consisting of N,N-methylenebisacrylamide, triallylcyanurate, divinylbenzene, divinylketones and diglycol diacrylate.

24. The process according to claim 15 wherein the exposing radiation is ultraviolet light.

25. The process according to claim 15, wherein the exposing radiation is provided by a high intensity incandescent light.

References Cited by the Examiner

UNITED STATES PATENTS

| | | | |
|---|---|---|---|
| 2,480,750 | 8/48 | Leary | 96—115 |
| 2,760,863 | 8/56 | Plambeck | 96—115 X |
| 2,964,401 | 12/60 | Plambeck | 96—115 |
| 2,996,381 | 8/61 | Oster et al. | 96—49 |

FOREIGN PATENTS

| | | |
|---|---|---|
| 1,055,814 | 4/59 | Germany. |

NORMAN G. TORCHIN, *Primary Examiner.*

PHILLIP E. MANGAN, *Examiner.*